(12) United States Patent
Weidinger et al.

(10) Patent No.: US 10,878,994 B2
(45) Date of Patent: Dec. 29, 2020

(54) APPARATUS FOR ABSORBING ELECTRICAL NOISE ON CABLES

(71) Applicant: Würth Elektronik eiSos GmbH & Co. KG, Waldenburg (DE)

(72) Inventors: Robert Weidinger, Salzburg (AT); Simon Trebuch, Salzburg (AT); Harald Schleich, Ainring (DE); Steffen Mütsch, Schöntal-Bieringen (DE); Nils-Henning Fiebig, Schwäbisch Hall (DE)

(73) Assignee: Würth Elektronik eiSos GmbH & Co, KG, Waldenburg (DE)

( * ) Notice: Subject to any disclaimer, the term of this patent is extended or adjusted under 35 U.S.C. 154(b) by 510 days.

(21) Appl. No.: 15/559,192

(22) PCT Filed: Feb. 25, 2016

(86) PCT No.: PCT/EP2016/053915
§ 371 (c)(1),
(2) Date: Sep. 18, 2017

(87) PCT Pub. No.: WO2016/150638
PCT Pub. Date: Sep. 29, 2016

(65) Prior Publication Data
US 2018/0090264 A1    Mar. 29, 2018

(30) Foreign Application Priority Data
Mar. 23, 2015    (DE) .................... 10 2015 205 193

(51) Int. Cl.
*H01F 17/06*    (2006.01)
*H01F 27/33*    (2006.01)
(Continued)

(52) U.S. Cl.
CPC ............. *H01F 27/33* (2013.01); *C04B 35/26* (2013.01); *H03H 1/0007* (2013.01);
(Continued)

(58) Field of Classification Search
CPC ...................... H05K 9/0066; H01F 2017/065
(Continued)

(56) References Cited

U.S. PATENT DOCUMENTS

| 5,003,278 A | 3/1991 | May |
| 5,942,964 A | 8/1999 | Takeuchi |

(Continued)

FOREIGN PATENT DOCUMENTS

| JP | 1996-167524 | 6/1996 |
| JP | 1998-041671 | 7/1996 |

(Continued)

OTHER PUBLICATIONS

English translation of JP2012114304 (Year: 2012).*
(Continued)

*Primary Examiner* — Ronald Hinson
(74) *Attorney, Agent, or Firm* — Boyle Fredrickson, S.C.

(57) ABSTRACT

An apparatus for absorbing electrical noise on cables that includes a housing which contains two partial shells, each partial shell receiving one element which is composed of a material which decreases or absorbs noise. In a closed state, two end sides of the housing each have one opening for a cable to be routed through. The apparatus further includes at least one fixing means for securing the housing to the cable, with the fixing means being arranged on at least one end side of the housing in the region of the opening, and having at least two clips, the limbs of which face one another and can be deformed transverse to the cable and form a slot for receiving the cable in a clamping manner between them. The limbs of the two clips running parallel to one another.

13 Claims, 2 Drawing Sheets

(51) Int. Cl.
*H03H 1/00* (2006.01)
*C04B 35/26* (2006.01)
*H05K 9/00* (2006.01)

(52) U.S. Cl.
CPC ... *H05K 9/0066* (2013.01); *H03H 2001/0028* (2013.01); *H03H 2001/0057* (2013.01)

(58) Field of Classification Search
USPC .......................................................... 336/175
See application file for complete search history.

(56) References Cited

U.S. PATENT DOCUMENTS

| | | |
|---|---|---|
| 6,262,361 B1 | 7/2001 | Konz |
| 6,437,678 B1 | 8/2002 | Konz |
| 8,263,868 B2 | 9/2012 | Konz |
| 2015/0208516 A1 | 7/2015 | Yamashita et al. |

FOREIGN PATENT DOCUMENTS

| | | |
|---|---|---|
| JP | 2000012333 | 1/2000 |
| JP | 2006024704 | 1/2006 |
| JP | 2012-114304 | 6/2012 |
| JP | 2013-254762 | 12/2013 |
| KR | 20140021514 | 2/2014 |

OTHER PUBLICATIONS

English translation of JP08167524 (Year: 1996).*
Korean Office Action dated Aug. 21, 2018; 6 pages.
Japanese Office Action drafted Oct. 15, 2018; 9 pages.

* cited by examiner

APPARATUS FOR ABSORBING ELECTRICAL NOISE ON CABLES

FIELD OF THE INVENTION

The invention proceeds from an apparatus for absorbing electrical noise on a cable.

BACKGROUND

Apparatuses of this kind are known. Elements which are composed of ferrite and which are of two-part design, so that they can be retrofitted to a cable, are usually used to absorb electrical noise. Each element contains a channel which, after the two elements are assembled, forms a passage for the cable. These ferrite elements are accommodated in housings which are composed of two partial shells.

In a known apparatus of this kind, fingers are arranged on the end sides of the two partial shells, the said fingers being directed obliquely outwards and the ends of the said fingers resting on the cable when the housing is closed (U.S. Pat. No. 5,003,278).

An apparatus of this kind, in which in each case one fixing means, which has a slot with two parallel edges for receiving the cable, is fitted to the two end sides of a partial shell, is likewise known (EP 1 039 632 A2). Securing by clamping is achieved by the edges being pushed to a greater or lesser extent into the insulation of the cable. The fixing means is in each case arranged on the outer side of the housing.

An apparatus in which fixing means are likewise arranged on the outer side of the end sides of a partial shell is also known. The fixing means have a slot with parallel edges for receiving the cable. The webs on which the edges are formed can be pivoted about an axis perpendicular to the longitudinal axis of the cable (DE 10 2006 027 312 A1).

The known apparatuses are intended to be retrofitted to cables. Said apparatuses can in each case be fitted to cables with a specific diameter range which is determined and therefore limited by the deformation range of the fixing means.

SUMMARY

The invention is based on the object of providing an apparatus for absorbing noise on cables, which apparatus can be used for cables with a relatively large diameter range.

In order to achieve this object, the invention proposes an apparatus having the features cited in claim 1. Developments of the invention are the subject matter of dependent claims.

The apparatus which is proposed by the invention therefore contains, as fixing means, at least one clip, the limbs, which face a cable which is to be inserted or has been inserted and can be deformed transverse to the cable, of the said clips forming a border of a slot for receiving a cable in a clamping manner, in particular two clips which form a slot for receiving the cable in a clamping manner between them. The clip or clips is/are adjusted to match different cable diameters by deformation of the clip or the clips themselves which are deformed transverse to the longitudinal direction of the passage for the cable. If there is only one clip, a border of the slot which is opposite the clip is formed by a suitable stop or else the boundary of the opening of the housing. When there is only one clip, a larger cable cross section can be Q accommodated than when there are two clips, but the clamping force is lower.

A larger range of diameters can be covered by this kind of deformation.

In a development of the invention, it can be provided that the at least one clip is of U-shaped design, and the ends of the limbs of the clip are integrally formed on the partial shell of the housing.

This shape of the clip permits deformation in a wide range, without the forces which occur in the process varying to an excessive extent. The forces which occur when the said clip is clamped to the cable can be distributed between a deformation of the limb and of the bow which connects the limbs of the clip. Since the ends of the limbs of the clip are integrally formed on a partial shell, virtually the entire clip is therefore available for deformation.

In a development of the invention, the inner side, which faces the cable which is to be inserted or has been inserted, of the limb has a ribbed portion which runs in the longitudinal direction of the limb.

The retaining force which acts on the cable can be increased in this way. When there are two opposite clips, it can be provided that the inner sides, which face one another, of the limbs, which form the slot between them, have a ribbed portion which runs in the longitudinal direction of the limbs and which therefore runs transverse to the direction of the cable. The ribbed portion can comprise a plurality of ribs. This results in particularly effective enhancement of the securing of the housing to the cable, without excessively high clamping forces being required.

In a development of the invention, it can be provided that the limbs of each clip run at least approximately parallel to one another.

In a further refinement of the invention, it can be provided that the limbs, which face one another, of the two clips, which form a fixing means, run parallel to one another.

It can be provided that the cross section of the limbs which face one another is rectangular, so that the ribbed portion has a particularly simple configuration.

In a further refinement of the invention, it can be provided that two fixing means are formed on the same partial shell. Therefore, the housing can be fitted to the cable in a particularly simple manner even in the open state, in order to then be able to close the said housing.

The invention proposes arranging the clips on the inner side of the housing, that is to say on the inner side of the end sides of the housing, it being possible to provide a small spacing between the respective inner side and the clips, so that the clips can be designed in a very flexible manner. Therefore, the fixing means do not project beyond the end side of the housing, so that the outer side of the housing can be smooth and therefore can also be configured without projections.

It can be provided that the housing has a locking device in order to lock the said housing in the closed state such that it no longer opens of its own accord. This locking device can have elastic tongues with projections which engage into corresponding openings in the respectively other partial shell.

In a development of the invention, the housing can have a centring device for ensuring the correct orientation of the two partial shells when closing the housing.

The said centring device may be, for example, a projection which has a slot and interacts with a rib on the respectively other partial shell in such a way that the rib engages into the slot in the projection.

It can be provided that the two partial shells of the housing are connected to one another in an articulated manner, for example at the edges, which run in the cable direction, of the two partial shells. The closing movement is therefore a pivoting movement about an axis parallel to the passage through the housing. In this case, the outer side of the said projection, which projection has a slot and projects beyond a longitudinal edge of one partial shell, can be formed such that it is matched to this pivoting movement, that is to say runs in an oblique or bent manner.

It goes without saying that it is also possible for the two partial shells to be inserted one into the other, that is to say to not be connected to one another in an articulated manner.

In a development of the invention, each partial shell has means for positioning in each case one of the elements which are composed of a material which reduces or absorbs noise relative to the partial shell.

In a development of the invention, the means for positioning the elements, in particular the ferrite elements, are designed as obliquely arranged centring webs which, when the elements are inserted into a respective partial shell, move the elements into their intended position between the end walls of the partial shell.

Therefore, the centring webs define oblique planes which, when the elements are inserted into the respective partial shell, automatically move the said elements into the intended position relative to the partial shell by simply pushing them in.

In a development of the invention, each end wall is provided with at least one centring web, with a distance between the centring webs in the direction of a base of the respective partial shell being reduced.

Owing to the centring webs being arranged in this way, the elements can be correctly positioned by simply pushing the elements, for example ferrite elements in the form of half-shells, into the partial shell of the housing.

In a development of the invention, the centring webs are connected to the partial shell and elastically deformable only at one end.

In this way, the centring webs can be elastically deformed and can exert a spring force when the elements are pushed in. Even when the elements have reached their final position in the partial shell, the centring webs provide a pretensioning force on the elements, so that the said elements can be held in the partial shell without rattling. The centring webs are advantageously connected to a respective end wall of the partial shells. A passage opening in the base of the respective partial shell is then arranged beneath the centring webs as viewed in the direction of the base of the respective partial shell. This makes it easier to produce the partial shell by means of injection moulding, in particular plastic injection moulding, since the centring webs can then be simply removed from the mould together with the partial shell.

In a development of the invention, means for stabilizing the clips against axial tension on the cable in the closed state of the housing are provided.

In a development of the invention, the means for stabilizing the clips have pins which are provided on that partial shell which does not have a clip and which, in the closed state of the housing, fill an intermediate space between the limbs which make contact with the inserted cable and the adjacent end wall of the partial shell which is provided with the clips.

In this way, the clips can be secured against axial tension on the cable in the direction of the respectively adjacent end wall. If clips are advantageously respectively arranged on the two opposite end walls of the partial shell, the clips on one end side are secured against tension on the cable in one direction, and the clips on the opposite end wall are secured against tension on the cable in the opposite direction.

Therefore, irrespective of the direction in which the cable is tensioned, the tensioning force is in each case dissipated between the respective clip and the respectively adjacent end wall by the pins, so that the clips cannot be deformed or even damaged by axial tension on the cable.

Further features, details and preferences of the invention can be gathered from the claims and the abstract, the wording of the said claims and abstract being incorporated in the description by reference, from the following description of preferred embodiments of the invention and on the basis of the drawing. In this case, individual features of the different embodiments can be combined in any desired manner without departing from the scope of the invention.

DETAILED DESCRIPTION

Figure 1:
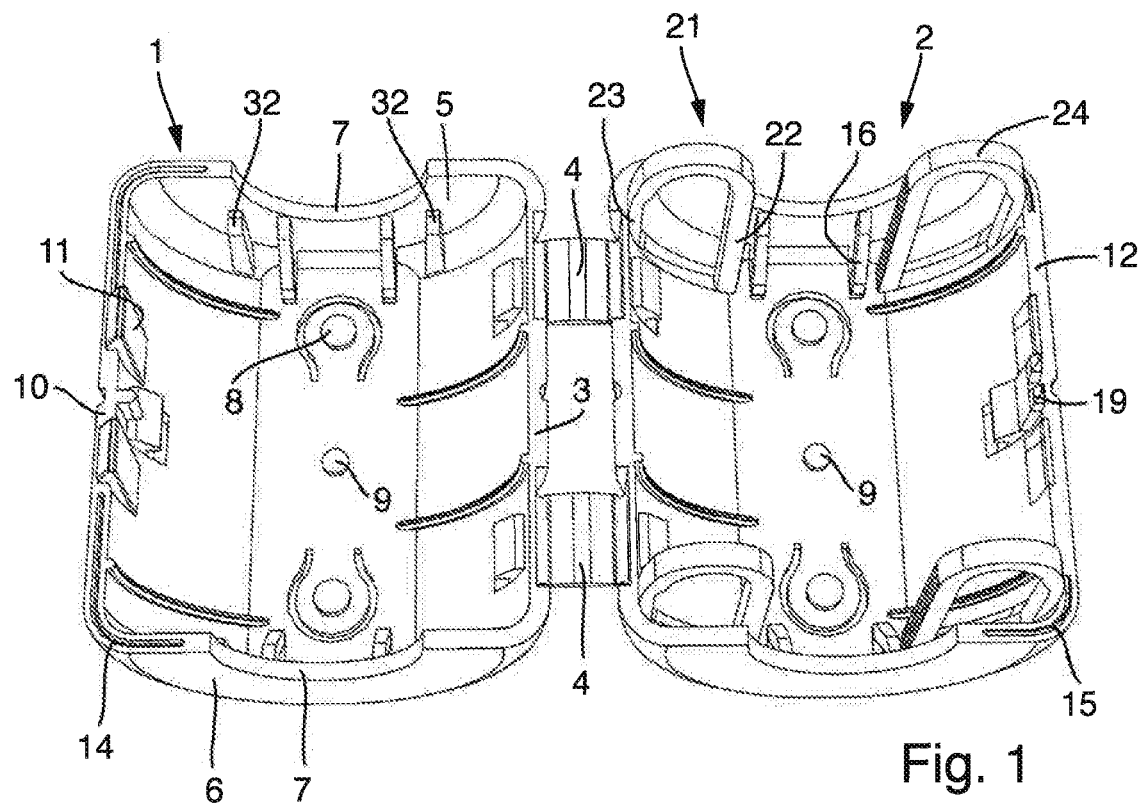
FIG. 1 shows a perspective view of an open housing without the ferrite elements.

The housing, illustrated in the figures, of an apparatus for absorbing electrical noise on cables contains two partial shells 1, 2 which are connected to one another in an articulated manner along a longitudinal edge 3 with the aid of film hinges 4. As a result, the two partial shells 1, 2 can be pivoted about an axis which runs parallel to the longitudinal edge 3 and can be closed in order to form a closed housing. Each partial shell 1, 2 is intended to receive a ferrite element, not illustrated in the drawings. The two partial shells 1, 2 are of barrel-shaped design, and therefore approximately have a cross section in the form of half a circular cylinder.

Each half-shell 1, 2 has, in its respective end side 5, 6, in each case one semicircular notch 7 which, in the folded-together and therefore closed state of the housing, respectively form a circular passage for a cable. The openings in the two end walls 5, 6, which openings are then in alignment with one another, form passage for the cable.

In the illustrated embodiment, the housing is longer in the direction of the passage for the cable than in the transverse direction, but this is not absolutely necessary. When the terms "longitudinal direction" and "transverse direction" are used in the text which follows, the longitudinal direction is intended to be understood to mean the direction of the passage for the cable.

The base of each partial shell 1, 2 has two spring elements 8 which are offset in the longitudinal direction and which are used to act on the two ferrite elements in the closed state of the housing such that the two ferrite elements are pushed towards one another. A compensation protection 9 which is likewise used to ensure that the two ferrite elements rest against one another in the correct manner is provided centrally between the two spring elements 8 in the longitudinal direction.

Two latching tongues 11 are integrally formed on the outer longitudinal edge 10, which faces away from the film hinges 4, of the partial shell 1 which is on the left-hand side in FIG. 1, the latching lugs of the said latching tongues engaging into two openings 13, which are provided on the corresponding outer longitudinal edge 12 of the respectively other partial shell 2, when the housing is closed. These latching tongues 11, together with the openings 13, form a locking device for locking the housing in the closed state.

Shaped portions in the form of slot 14 and spring 15 are provided in the region of the corners of the outer longitudinal edges 10, 12 with the respective end walls 5, 6, and therefore the housing remains in the closed state even when it is subjected to loading from the outer side in the closed state. The arrangement in the corner regions is used to provide protection both under transverse loads and under longitudinal loads.

Obliquely running centring webs 16 which, when the ferrite elements are inserted, move the said ferrite elements into their correct position centrally between the end walls 5, 6 are formed on the inner sides of the end walls 5, 6 of the two partial shells 1, 2. In order that the ferrite elements remain firmly held in the respective half-shell, projections 17 are integrally formed on the inner side of the longitudinal walls of the half-shells. The said projections engage into corresponding shaped portions of the ferrite elements.

In order that a correct position is quickly assumed when the housing is closed by pivoting the two half-shells, a centring device which has a projection 19 which projects beyond the longitudinal edge 12 of one partial shell 2 is provided. This projection 19 has a slot 20, so that two tines are formed. The position of the slot 20 which runs transverse to the longitudinal edge 12 corresponds to a rib 31 which is arranged on the inner side of the other longitudinal edge 10 of the other partial shell 1. Therefore, when the housing is closed, the rib 31 comes to lie in the slot 20 in the projection 19.

The outer side of the projection 19 is, in a manner corresponding to the curvature of the inner side of the other partial shell 1, likewise of somewhat curved or oblique design.

Figure 2:
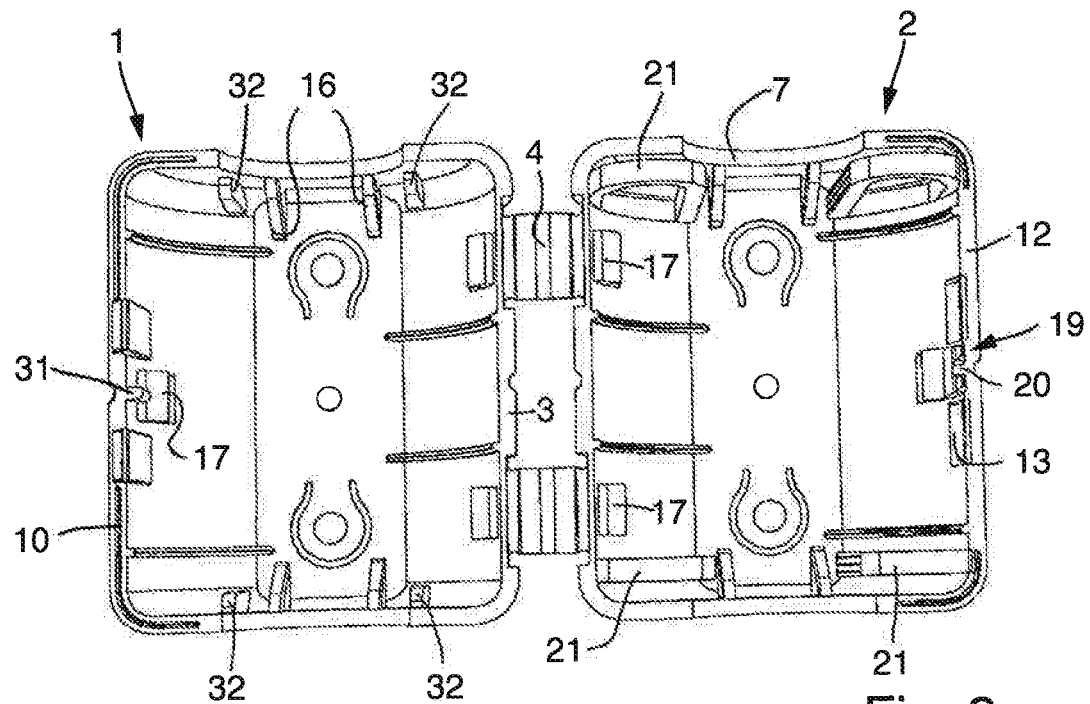
FIG. 2 shows a perspective view from another direction.
Figure 3:
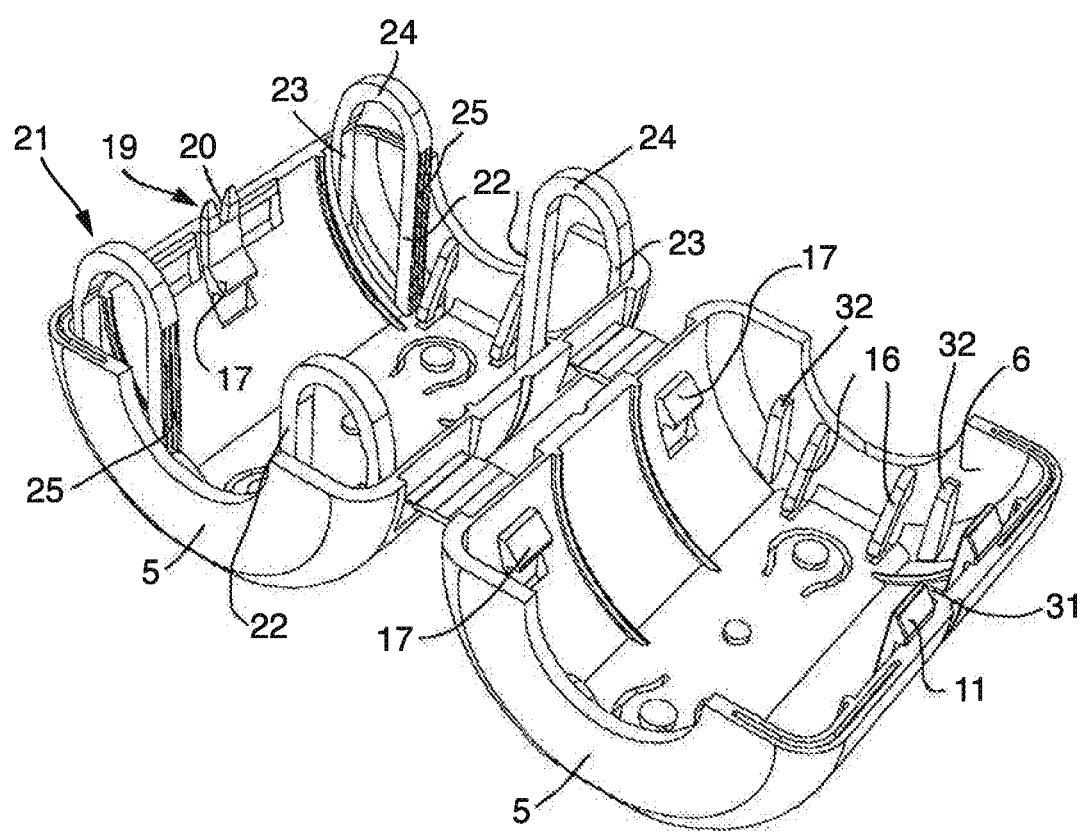
FIG. 3 shows a view on an enlarged scale.

A fixing device comprising two clips 21 is in each case arranged on the inner side of the two end walls 5, 6 of the partial shell 2 which is on the right-hand side in FIGS. 1 and 2, at a distance from the said end walls. Therefore, a total of four clips 21 are arranged on the partial shell 2. The two clips 21 on the end wall, which is at the top in FIG. 1, of the partial shell 2 form a fixing device or a fixing means for a cable, and the two clips 21 on the end wall, which is at the bottom in FIG. 1, of the partial shell 2 form a fixing device or a fixing means for the cable. Each clip 21 is of U-shaped design and has an inner limb 22, an outer limb 23 and a bow 24 which connects the two limbs. The outer limb 23 runs parallel to the inner limb 22, and the inner limbs 22 of the two clips, which inner limbs face one another, likewise run parallel to one another. The inner limbs 22, like a bar, can be deformed transverse to the longitudinal direction of the housing, wherein the ability to deform is also assisted by deformation of the bow 24.

The inner sides of the inner limbs 22, which inner sides face one another, have a ribbed portion 25 which runs in the longitudinal direction of the limbs and which intensifies the retaining force on the cable.

The ends of the limbs 22, 23 are connected to the partial shell 2 by integral formation. By way of example, the clips 21 are produced together with the partial shells 1, 2 by means of plastic injection moulding. The partial shell 2 has a passage opening between the respective ends of the limbs 22, 23 in order to make it easier to remove the partial shell 2 from the mould. The bow 24 not only forms a possible point of deformation, but at the same time an insertion slope for pushing the partial shell 2 onto the cable. The outer sides, which face away from the slot which is formed between the inner limbs 22, of the bow 24 which connects the limbs are matched to the inner shape of the respectively other partial shell 1 such that the partial shell can be guided directly past the bow 24 during closing, and the bow 24 can still bear on the inner side of the partial shells. When the partial shells 1, 2 are closed, the clamping force which is applied onto the cable by means of the inner limbs 22 can be further intensified as a result.

The partial shell 1, which is illustrated on the left-hand side in FIG. 1 and FIG. 2 in each case, of the housing, that is to say that partial shell 1 which does not have a clip 21, is provided with two integrally formed pins 32 in the region of the respective housing opening on each side. These pins 32 project from the respective end wall of the partial shell 1 in the direction of the interior of the said partial shell. In the closed state of the two partial shells 1, 2, the pins 32 fill an intermediate space between the limbs 22, which make contact with the cable which has been inserted, and the respective end wall of the housing shell 1. In this way, the clips 21 are stabilized against axial tension on the cable in the closed state of the housing. The clips 21 which are situated at the top of the partial shell 2 in FIG. 2 are stabilized against axial upward tension by the projections 32, whereas the clips 21 which are at the bottom in FIG. 2 are stabilized against axial downward tension by the projections 32. Axial tension on a cable, which has been inserted, in both directions can therefore be absorbed by the projections 32 on the end wall, which is at the top in FIG. 2, of the partial shell 1 or by the projections 32 on the end wall, which is at the bottom in FIG. 2, of the partial shell 1.

The invention claimed is:

1. Apparatus for absorbing electrical noise on cables, comprising
   a housing which contains two partial shells for receiving in each case one element which is composed of a material which decreases or absorbs noise, which housing,
   in the closed state, has in each case one opening for a cable, which is to be routed through, in the two end sides, and also comprising
   at least one fixing means for securing the housing to the cable, with the fixing means being arranged on at least one end side of the housing in the region of the opening,
   having at least two clips, the limbs, which face one another and can be deformed transverse to the cable, of the said clips forming a slot for receiving the cable in a clamping manner between them, with the limbs, which face one another, of the two clips running parallel to one another,
   wherein means for stabilizing the clips against axial tension on the cable in the closed state of the housing are provided, and
   further wherein the means for stabilizing the clips have pins which are provided on that partial shell which does not have a clip and which, in the closed state of the housing, fill an intermediate space between the limbs which make contact with the inserted cable and the adjacent end wall of the partial shell with the clips.

2. Apparatus according to claim 1, wherein the at least two clips are of U-shaped design, and the ends of the limbs are integrally formed on the partial shell.

3. Apparatus according to claim 1, wherein the inner sides, which face one another, of the limbs have a ribbed portion which runs in the longitudinal direction of the limbs.

4. Apparatus according to claim 1, wherein the limbs of each clip run parallel to one another.

5. Apparatus according to claim 1, wherein the cross section of the limbs which face one another is rectangular.

6. Apparatus according to claim 1, wherein two fixing means are arranged on the same partial shell.

7. Apparatus according to claim 1, comprising a locking device for locking the housing in the closed state.

8. Apparatus according to claim 1, comprising a centring device for ensuring the correct orientation of the two partial shells when closing the housing.

9. Apparatus according to claim 1, wherein the two partial shells of the housing are connected to one another in an articulated manner such that they can be pivoted.

10. Apparatus according to claim 1, wherein each partial shell has means for positioning in each case one of the elements which are composed of a material which reduces or absorbs noise relative to the partial shell.

11. Apparatus according to claim 10, wherein the positioning means are designed as obliquely arranged centring webs which, when the elements are inserted into a respective partial shell, move the elements into their intended position between the end walls of the partial shell.

12. Apparatus according to claim 11, wherein each end wall is provided with at least one centring web, with a distance between the centring webs in the direction of a base of the respective partial shell being reduced.

13. Apparatus according to claim 11, wherein the centring webs are connected to the partial shell and elastically deformable only at one end.

\* \* \* \* \*